(12) United States Patent
Villuendas Yuste et al.

(10) Patent No.: US 10,126,020 B2
(45) Date of Patent: Nov. 13, 2018

(54) SELECTIVE SOLAR ABSORBING COATING AND MANUFACTURING METHOD

(71) Applicant: Abengoa Solar New Technologies, S.A., Sevilla (ES)

(72) Inventors: Francisco Villuendas Yuste, Zaragoza (ES); Carlos Alcañiz Garcia, Sevilla (ES); Rafael Alonso Esteban, Zaragoza (ES); Javier Pelayo Zueco, Zaragoza (ES); Jesús Mario Subías Domingo, Zaragoza (ES); Carlos Heras Vila, Zaragoza (ES); Noelia Martínez Sanz, Sevilla (ES)

(73) Assignee: Abengoa Solar New Technologies, S.A., Sevilla (ES)

( * ) Notice: Subject to any disclaimer, the term of this patent is extended or adjusted under 35 U.S.C. 154(b) by 289 days.

(21) Appl. No.: 14/673,548

(22) Filed: Mar. 30, 2015

(65) Prior Publication Data

US 2015/0267303 A1    Sep. 24, 2015

Related U.S. Application Data

(62) Division of application No. 13/123,695, filed as application No. PCT/ES2009/000489 on Oct. 8, 2009, now Pat. No. 9,423,157.

(30) Foreign Application Priority Data

Oct. 20, 2008    (ES) .................................. 200802953

(51) Int. Cl.
*C23C 14/00*    (2006.01)
*C23C 14/06*    (2006.01)
(Continued)

(52) U.S. Cl.
CPC ........... *F24S 70/20* (2018.05); *C23C 14/0036* (2013.01); *C23C 14/06* (2013.01); *C23C 14/165* (2013.01);
(Continued)

(58) Field of Classification Search
CPC ........... G02B 1/11; G02B 1/113; G02B 1/115; G02B 1/116; G02B 5/20; G02B 5/204;
(Continued)

(56) References Cited

U.S. PATENT DOCUMENTS 3,272,986 A    9/1966    Schmidt
4,101,200 A    7/1978    Daxinger
(Continued)

FOREIGN PATENT DOCUMENTS

CN    1159553    9/1997
DE    3538390 A1 *    4/1987    ............... C23C 4/02
(Continued)

OTHER PUBLICATIONS

Machine translation of DE 3538390 A1.*
(Continued)

*Primary Examiner* — Kimberly N Kakalec
(74) *Attorney, Agent, or Firm* — Kilpatrick Townsend & Stockton LLP

(57) ABSTRACT

Selective solar absorbent coating and manufacturing method, with solar absorption and low emissivity properties. The coating comprises a substrate (1) of metal, dielectric or ceramic material, at least one highly reflective metal layer (2) in mid-far infrared applied to the substrate itself which provides low emissivity properties, a mufti-layer structure of alternating dielectric and metallic layers (3) of subnanometric thickness applied to the reflective metal layer and at least one dielectric layer (4) that acts as an anti-reflective layer for the solar spectrum. The coating is applicable as a selective
(Continued)

absorbent coating in absorbent tubes for parabolic-trough solar collectors, in solar panels for hot water, heating or domestic cooling, both in the form of absorbent tubes and absorbent sheets, in capture systems in tower solar thermo-electric power plants, and in capture systems in Stirling disk systems.

19 Claims, 3 Drawing Sheets

(51) Int. Cl.
| | |
|---|---|
| C23C 14/16 | (2006.01) |
| C23C 14/18 | (2006.01) |
| C23C 14/35 | (2006.01) |
| C23C 16/06 | (2006.01) |
| C23C 28/00 | (2006.01) |
| F24S 70/20 | (2018.01) |
| F24S 70/25 | (2018.01) |
| F24S 70/30 | (2018.01) |

(52) U.S. Cl.
CPC ............ *C23C 14/185* (2013.01); *C23C 14/35* (2013.01); *C23C 16/06* (2013.01); *C23C 28/321* (2013.01); *C23C 28/322* (2013.01); *C23C 28/34* (2013.01); *C23C 28/345* (2013.01); *C23C 28/3455* (2013.01); *F24S 70/25* (2018.05); *F24S 70/30* (2018.05); *Y02B 10/20* (2013.01); *Y02E 10/40* (2013.01)

(58) Field of Classification Search
CPC . G02B 5/208; G02B 5/22; G02B 5/28; G02B 5/281; G02B 5/282; G02B 5/283; G02B 5/285; G02B 5/287
USPC .................................................. 428/615–686
See application file for complete search history.

(56) References Cited

U.S. PATENT DOCUMENTS

| | | | |
|---|---|---|---|
| 4,282,290 | A | 8/1981 | Pellicori et al. |
| 4,437,455 | A | 3/1984 | Jefferson |
| 4,582,764 | A | 4/1986 | Allerd et al. |
| 4,628,905 | A | 12/1986 | Mills |
| 5,523,132 | A | 6/1996 | Zhang et al. |
| 5,563,734 | A * | 10/1996 | Wolfe ............... C03C 17/36 204/192.27 |
| 9,476,115 | B2 | 10/2016 | Chandra |
| 2002/0012797 | A1 | 1/2002 | Bijkerk et al. |
| 2002/0073988 | A1 | 6/2002 | Reichert et al. |
| 2004/0126594 | A1 | 7/2004 | Rubbia et al. |
| 2005/0134959 | A1 | 6/2005 | Simpson et al. |
| 2005/0189525 | A1 | 9/2005 | Kuckelkorn et al. |
| 2005/0280890 | A1 | 12/2005 | Otani et al. |
| 2007/0209658 | A1 | 9/2007 | Riffelmann et al. |
| 2010/0313875 | A1 | 12/2010 | Kennedy |
| 2011/0249326 | A1 | 10/2011 | Villuendas Yuste et al. |

FOREIGN PATENT DOCUMENTS

| | | |
|---|---|---|
| EP | 0104708 A2 | 4/1984 |
| EP | 0107412 A1 | 5/1984 |
| ES | 2232557 | 6/2005 |
| JP | H02-22863 B2 | 5/1990 |
| JP | 2006-500624 A | 1/2006 |
| WO | 97/00335 | 1/1997 |
| WO | 2005/121389 A1 | 12/2005 |
| WO | 2010/046509 A1 | 4/2010 |

OTHER PUBLICATIONS

Mantina et al., Atomic Radii of the Elements, CRC Handbook of Chemistry and Physics, 94th Edition, Internet Edition 2014, pp. 9-49 through 9-50.

Thornton et al., "Sputter-deposited Al2O3/Mo/Al2O3 selective absorber coatings", Thin Solid Films, vol. 72, Issue 1, pp. 101-109 [Sep. 15, 1980].

Thornton et al., Thermal stability studies of sputter-deposited multilayer selective absorber coatings, Thin Solid Films, vol. 96, Issue 2, pp. 175-183 [Oct. 8, 1982].

Wikipedia, Atomic radii of the elements (data page). Available at: http://en.wikipedia.org/wiki/Atomic_radii_of_the_elements_(data_page) (accessed Aug. 26, 2015).

Zhang et al. "New Cermet Solar Coatings for Solar Thermal Electricity Applications". Solar Energy 64, Nos. 1-3 (1998) 109-114.

Zhang, Q. "Recent progress in high-temperature solar selective coatings". Solar Energy Material & Solar Cells. 62 (2000) pp. 63-74.

Zhang "Stainless-steel-AlN Cermet Selective Surfaces Deposited by Direct Current Magnetron Sputtering Technology". Solar Energy Materials and Solar Cells 52 (1998) pp. 95-106.

International Search Report and Written Opinion of Patent Application No. PCT/ES2009/000489 dated Jan. 25, 2010, 8 pages.

International Preliminary Report on Patentability for Patent Application No. PCT/ES2009/000489 dated May 10, 2011, 6 pages.

Farooq et al., "A novel design in composities of various materials for solar selective coatings," *Solar Energy Materials & Solar Cells* 71 (2002) 523-535.

Lampert, Carl M., "Coatings for enhanced photothermal energy collection," *Solar Energy Materials* 1 (1979) 319-341.

Baumeister, Philip W., "Optical coating technology," *SPIE Press Monograph* (2004) vol. PM137, 6 pages.

* cited by examiner

SELECTIVE SOLAR ABSORBING COATING AND MANUFACTURING METHOD

CROSS-REFERENCES TO RELATED APPLICATIONS

This application is a division of U.S. patent application Ser. No. 13/123,695, filed on Jun. 23, 2011, entitled "Selective Solar Absorbent Coating And Manufacturing Method," which is a U.S. national stage filing under 35 U.S.C. 371 of International Application No. PCT/ES2009/000489, filed Oct. 8, 2009, entitled "Selective Solar Absorbent Coating And Manufacturing Method," which application claims priority to Spanish Application No. P200802953, filed Oct. 20, 2008, the disclosures of which are hereby incorporated by reference in their entirety for all purposes.

TECHNICAL FIELD OF THE INVENTION

The present invention refers to a selective absorbing coating that comprises of: (i) a substrate, one or more metallic layers that confer low emissivity properties (ii) a structure of multiple alternating subnanometer thickness dielectric and metallic layers in which solar energy absorption is produced; and (iii) a layer or multilayered structure that provides antireflective properties.

The invention also includes the method and process of manufacture and the use of said selective solar absorbent coating.

BACKGROUND TO THE INVENTION

The capture of solar energy, in terms of the thermal capture aspect, is of increasing technological and economic importance from the point of view of hot water production, heating and refrigeration at a domestic level as well as electricity generation in solar thermoelectric power plants.

These systems require maximum solar energy absorption and the minimum possible loss of energy. With this end in mind, these systems are configured in vacuum tubes or similar structures that reduce losses by conduction and convection and possess coatings with a great capacity for solar energy absorption and low emissivity characteristics to reduce energy losses through thermal radiation in far infrared.

Consequently, in the domestic area as well as in the production of electricity, selective absorbent coatings play an essential role. There are numerous records of absorbent coatings such as those described in patents WO2005/121389, U.S. Pat. No. 4,582,764, U.S. Pat. No. 4,628,905, U.S. Pat. No. 5,523,132, US2004/0126594, US2005/0189525, US2007/0209658, WO97/00335, as well as several others. In all of these the absorbent coating consists of a metallic layer that provides low emissivity characteristics, one or more layers of dielectric materials doped with "Cermets" metallic elements, which act as absorbent layers for solar radiation and a dielectric layer that provides antireflective properties. In some of these there is also an additional dielectric layer that acts as a blocking layer against the diffusion of different materials. The layers of cermets are absorbent layers, complex refraction index, where the capacity for absorption is provided by the co-dopant metal element whose concentration can be constant or gradual within each of the layers.

Cermets are habitually oxides or metal nitrides doped with metallic elements such as Mo, Ni, Ti, Ta, Al, etc., that are usually deposited through codeposition techniques through reactive cathodic spraying "reactive sputtering". Codeposition through reactive sputtering consists in simultaneous evaporation of two materials through sputtering in the presence of, in addition to the inert gas, a reactive Gas, oxygen, nitrogen etc., residual in the deposition chamber. The residual gas reacts with one of the evaporated materials forming the corresponding dielectric compound, while part of the other compound is deposited in metal form. Reactive gas reacts both with the material that forms the dielectric compound and the doping metal, so to obtain the cermets with the appropriate absorption a stringent control of the stoichiometry process is required. The stoichiometry process is conditioned by the composition and partial pressures of the gases in the vacuum chamber in relation to the reactive gas consumption, and therefore depends on the evaporation speed, that is, cathode power, of its state, making accurate control of the stoichiometry process very difficult, requiring certain feedback mechanisms that can negatively affect the properties of the coatings.

Likewise, part of the codopant metal also reacts with the reactive gas and forms dielectric compounds, so this metal does not therefore contribute to the absorption of the layer and requires large concentrations of codopant metal. Besides, this technique also presents limitations when choosing codopant metals as they should possess much less affinity for the reactive gas than the principal metal that forms the dielectric compound.

DESCRIPTION OF THE INVENTION

This invention seeks to resolve all the difficulties set out above, as each of the cermet layers are replaced by an alternating multilayered dielectric and metal structure, with very thin layers, less than 10 nm and mainly under 1 nm. Dielectric layers are deposited through reactive sputtering, including inert gas and reactive gas in the chamber or part of the chamber where dielectric coatings are deposited. Metal layers are deposited through DC sputtering, introducing inert gas exclusively in the chamber or part of the chamber where metallic layers are deposited. As a result, precise control of the stoichiometry process is not required, since the depositing of the dielectric layers requires a composition of gases that guarantees the total reaction of the evaporated metal, while the metal nature of the alternating layers is determined by the inert gas introduced as process gas. As the depositing of both types of materials is realized in different chambers or in isolated parts of the same deposition chamber, gas mixture is minimal and no chemical reaction of the constituent material of the metal layers is produced. Likewise, as the deposition of dielectric and metal layers is realized in different places and with different gas compositions, there is no limit to the composition of dielectric and metallic layers, which can even be taken from the same batch of metal, forming dielectric layers from a metal element, such as oxides or nitrides of a metal, and metal layers of the same element.

The selective solar coating in this invention is designed to absorb solar energy and transform it into heat with low emissivity properties, facilitating and making the manufacturing process more robust and reliable and allowing greater possibilities for its design and optimization. The coating deposited on the substrate, which can be metallic or dielec tric, ensures the mechanical and thermal stability of the coating, and is essentially characterised by including:

- At least one highly reflective metallic layer in far infrared (spectral range between 5 and 50 μm wave length) that provides low emissivity characteristics of the coating deposited on the substrate.
- A multilayered structure deposited on the reflective layer, that provides solar radiation absorbing properties, formed by alternating metallic and dielectric layers of a very small thickness (less than 10 nm and generally less than 1 nm), that can be homogenous for metallic layers, on the one hand, and dielectric, on the other, throughout the structure, differentiated in various zones or with thicknesses that gradually vary along the structure.
- At least one dielectric layer deposited on the absorbing multilayered structure that acts as an antireflective layer.

Metal elements such as steel, stainless steel, copper or aluminium, and non-metallic elements such as glass, quartz or ceramic materials or polymers are included in this invention as substrate materials. The substrate can be subject to treatments, such as the oxidation of the superficial layer or thermal and cleaning treatments that optimise adhesion of the coating and therefore its mechanical and environmental stability.

Likewise, the current invention includes a coating absorbent of solar energy and reflective in medium-far infrared, that contains one or more metal layers on the substrate, highly reflective in medium-far infrared, a multilayered structure with thin alternating metallic-dielectric layers and one or more dielectric layers that form the antireflective structure for solar energy. The coating, according to the invention, is unique because of the highly reflective metal layer or layers deposited on the substrate include a metallic material selected from the group formed by silver (Ag), gold (Au), aluminium (Al), chromium (Cr), molybdenum (Mo), copper (Cu), nickel (Ni), titanium (Ti), niobium (Nb), tantalum (Ta), tungsten (W), palladium (Pd) or an alloy of the same or mixtures of the same.

According to another characteristic of the invention, the layers of dielectric material in the absorbent multi-layer structure consist in metal oxides and/or metal nitride elements, with a refraction index of between 1.4 and 2.4. The coating, according to the invention, is distinguished because the metal oxides are selected from the group consisting of tin oxides, zinc oxides, aluminium oxides, titanium oxides, silicon dioxides, nickel oxides, chromium oxides, indium oxides or a mixture of the same. Correspondingly, the coating, according to the invention, is unique because the nitrides of metal elements are selected from the group formed by silicon nitrides, chromium nitrides and aluminium nitrides, or mixtures of the same.

Likewise, the coating, according to the invention, is unique because the metal layers that form part of the absorbent multilayered structure are made from a metal selected from the group formed by silver (Ag), gold (Au), aluminium (Al), chromium (Cr), molybdenum (Mo), copper (Cu) nickel (Ni), titanium (Ti), niobium (Nb), tantalum (Ta), tungsten (W), palladium (Pd) or any alloy of the same or mixture of the same.

The invention equally contemplates the presence of one or more dielectric layers that act as an antireflective structure and these are made from metal oxides and/or metal nitride elements, with a refraction index between 1.4 and 2.4. The coating, according to the invention, is unique because metal oxides are selected from the group formed by tin oxides, zinc oxides, aluminium oxides, titanium oxides, silicon dioxides, nickel oxides, chromium oxides, indium oxides or mixtures of the same. Correspondingly, the coating, according to the invention, is unique because the nitrides of metal elements are selected the group formed by silicon nitrides, chromium nitrates and aluminium nitrides, or mixtures of the same.

In the context of the current invention the term "metallic alloy" means any of those that these metals can form between them or with other metals.

According to another characteristic of the invention, the thickness of each of the reflecting metallic layers in medium-far infrared, and each of the layers of dielectric material of the antireflective structure is between 1 and 500 nm. In addition, according to another characteristic of the invention, the thickness of each of the metallic and dielectric layers of the absorbing multilayered structured is less than 10 nm, with a total number of layers of the multilayered structure of more than 20. The multilayered structure can be configured as a homogenous zone, in which all the dielectric layers are of the same material and have the same thickness and all the metal layers are of the same metal and thickness, in various differentiated zones, in which each zones is configured as a homogenous zone and differs from the other zones in the material used for the dielectric layers and/or the metal used for the metal layers and/or the thickness of each of the metallic or dielectric layers, or can be configured as a gradual zone where the thickness of the metal and/or dielectric layers vary gradually. The preference is for the multilayered structure to be configured with at least two differentiated zones, in which the composition and/or thickness of the layers of one of the areas is different to the composition and/or thickness of the other.

All in all, the total number of layers of coating is over 25 and the total thickness is between 100 nm and 2000 nm.

The purpose of the invention is the fact that the different layers of coating are deposited through physical deposition techniques in vacuum in vapour phase (PVD, physical vapour deposition) such as thermal evaporation, electron gun, ionic implantation or "sputtering", by chemical deposition in vapour phase (CVD, chemical vapour deposition) or through electrolytic baths, with the sputtering technique being the preferred method for this task.

Another purpose of this invention is the use of the coating in absorbent tubes for parabolic cylinder collectors in solar thermoelectric plants.

Another purpose of this invention is the use of the coating in solar panels for hot water, heating or household refrigeration, both in the form of absorbent tubes as well as absorbent plates.

This invention also has the benefit that the coating can be used in capture systems at solar tower-type thermoelectric power plants, in which solar energy reflected by a multitude of heliostats is concentrated in the capture system positioned in a tower.

And, finally, it is also the purpose of this invention to use the coating in the capture system of Stirling dish systems.

With the aim of illustrating the advantages and properties of the coating in this invention and with the object of better understanding the characteristics of the invention, a detailed description of the ideal scenario will be provided, based on a set of drawings enclosed with this specification, where the following, for illustration but not limiting purposes, are represented:

Figure 1:
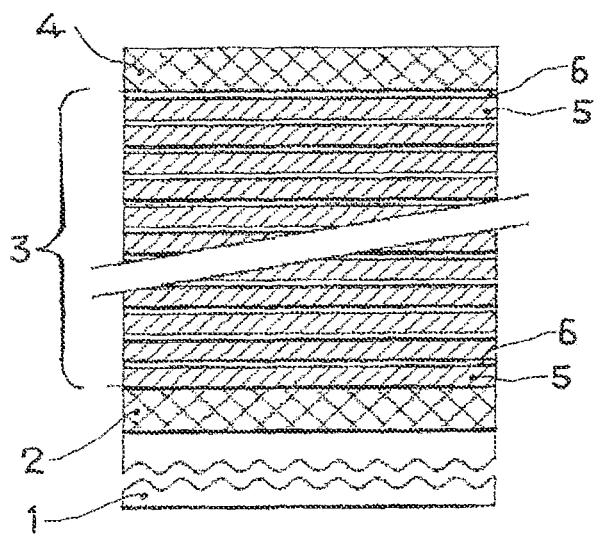
FIG. 1 shows a drawing of the transverse section of a coating, according to the invention, with the dielectric and metallic layers of the absorbent multilayered structure of the same material and thickness across the entire structure.

In the above figures the numerical references correspond to the following parts and elements.

1.—Substrate
2.—Reflective metallic layer
3.—Absorbent multilayered structure
4.—Antireflecting dielectric structure
5.—Dielectric layer
6.—Metallic layer
7.—Multilayered structure zone 1
8.—Multilayered structure zone 2
9.—Multilayered structure zone n

DETAILED DESCRIPTION OF THE DRAWINGS

The selective solar radiation absorbing coating in the invention includes, as shown in FIGS. 1 to 4, at least one substrate (1), at least one reflective metallic layer (2) that provides low emissivity properties, a multilayered structure (3) of alternating dielectric (5) and metallic (6) layers that act as an absorbent structure for the solar radiation and at least one dielectric layer (4) that acts as an antireflective structure.

The substrate (1) can be a metallic or dielectric material or a combination of both, that ensures mechanical stability of the coating.

The metallic reflecting layer (2) consists, in turn, of at least one highly reflective layer in medium-far infrared (2.5-20 μm wave length), said metallic layer being deposited on the substrate itself.

Figure 2:
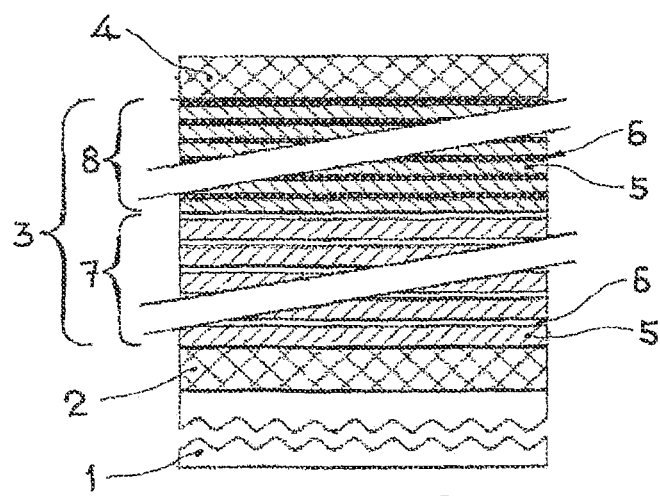
FIG. 2 shows a drawing of the transverse section of the coating, in accordance with the invention, in which the absorbent multilayered structure is divided in two zones where the dielectric and metallic layers are of a different composition and thickness in each zone.
Figure 3:
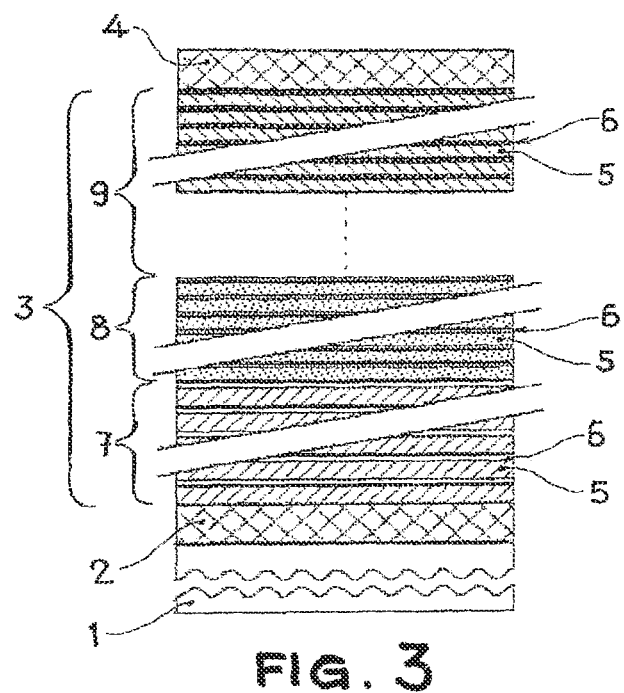
FIG. 3 shows a drawing of the transverse section of the coating, in accordance with the invention, where the absorbent multilayered structure is divided into several zones and the dielectric and metallic layers are of a different composition and thickness in each zone.
Figure 4:
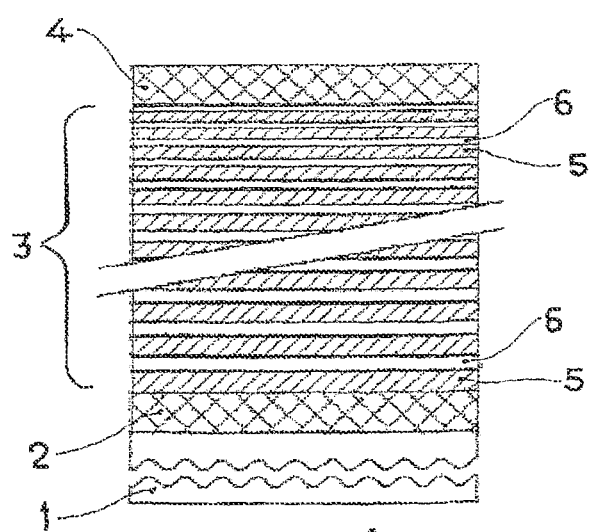
FIG. 4 shows a drawing of the transverse section of a coating, according to the invention, in which the absorbent multilayered structure includes only one area in which the dielectric and metallic layers vary in thickness progressively within the zone.

The absorbent multilayered structure (3) consists, in turn, in a series of alternating dielectric (5) and metallic (6) layers, deposited on the reflecting metallic layer (2), and can be of the same or different thickness and/or composition:

a) Dielectric layers (5) can be identical to each other, that is to say, of the same material and thickness, and the same is true for the metallic layers (6) which configure the multilayered structure in a unique differentiated zone represented in FIG. 1.
b) In a similar manner, there can be two types of dielectric layers (5) with different material and/or thickness and the same is true for the metallic layers (6) configuring the absorbent structure in two differentiated zones, with the first zone (7) consisting in dielectric and metallic layers of one type and the second zone (8) of another type, as seen in FIG. 2.
c) There can be several types of dielectric layers (5) and several types of metallic layers (6), configuring the structure in n zones, with n being an unlimited number of zones where the absorbent multilayer structure consists in a first zone (7), a second zone (8) and so on until the final n zone (9) with each formed by a type of dielectric layer and a type of metallic layer as seen in FIG. 3.
d) In the same way, the absorbent structure can consist in dielectric layers (5) and metallic layers (6) whose thickness gradually varies along the structure, configuring a single zone but with variable thicknesses in the different layers, metallic and/or dielectric, as shown in FIG. 4.

The antireflective structure (4) consists in at least one dielectric layer that provides solar energy antireflective properties.

FIGS. 1-4 show specific examples of selective absorbent coatings, according to the invention, in which a reflective layer (2) has been placed on the substrate (1), and on that has been placed a multilayered absorbent structure (3) consisting in a single zone, in two zones, in n zones and in a single zone with thicknesses of the dielectric and metallic layers that vary in said zone, and an antireflective layer (4) placed on the multilayered structure.

The substrates (1) correspond to metals such as steel, stainless steel, copper and aluminium and dielectrics such as glass, quartz, polymeric materials or ceramic materials, or a combination of different materials.

For the reflective metal layer (2) silver (Ag), gold (Au), aluminium (Al), chromium (Cr), Molybdenum (Mo), Copper (Cu), nickel (Ni), titanium (Ti), niobium (Nb), tantalum (Ta), tungsten (W), palladium (Pd) or a mixture of two or more of these or an alloy of said metals are used. These metal layers (2) have a thickness of between 5 and 1000 nm.

The layers of dielectric material (5) of the different configurations of absorbent multilayered structures have a refraction index of between 1.4 and 2.4. For this purpose metal oxides and/or metal element nitrides, such as tin oxides zinc oxides, aluminium oxides, titanium oxides, silicon dioxides, silicon-aluminium, nickel oxides, chromium oxides, niobium oxides, tantalum oxides or mixtures of the same are used; as well as silicon nitrides, chromium nitrides and aluminium nitrides, or mixtures of the same. The thickness of the dielectric layers (5) is less than 10 nm, preferably below 1 nm, the number of dielectric layers is more than 10, and the total thickness of the dielectric layers of the absorbent layer structure (3) is between 5 and 1000 nm.

For the realization of the metal layers (6) of the different configurations of the absorbent multilayer structures silver (Ag), gold (Au) aluminium (Ai), chromium (Cr), Molybdenum (Mo), copper (Cu), nickel (Ni), titanium (Ti), niobium (Nb), tantalum (Ta), Tungsten (W) palladium (Pd), or an alloy of the same or mixtures of the same are used. The thickness of the metal layers (6) are less than 10 nm, preferably below 1 nm, the number of metal layers is above 10, and the total thickness of the metal layers of the absorbent multilayered structure (3) is between 5 and 1000 nm.

The layers that form the antireflective structure (4) have a refraction index of between 1.4 and 2.4. For this purpose, metal oxides and/or nitrides of metal elements are used, such as tin oxide, zinc oxide, aluminium oxide, titanium oxides, silicon oxides, silicon-aluminium oxides, nickel oxides, or mixtures of the same; as well as silicon nitrides and aluminium nitrides, or mixtures of the same. The thickness of the layers of dielectric material of the antireflective structure is between 5 and 1000 nm.

Finally, with the idea of increasing adherence between the coating and the substrate, the substrate can be subjected to diverse treatments, such as the oxidation of the superficial layer or thermal and cleaning treatments, since improving the adhesion of the coating implies more mechanical and environmental stability.

So to obtain the coating of the invention in a manner that a first metal layer is placed (2) onto the substrate (1) of the metal or dielectric material, and onto this is placed the first metal layer (2), and onto this is deposited the first of the layers that form the absorbent multilayered structure, with the first layer being either the dielectric (5) or metal (6) material. After this first layer the rest of the metal (6) and dielectric (5) layers are alternately deposited, and can have identical or different thicknesses and/or compositions, forming the absorbent multilayered structure. After the last of the layers of the absorbent multilayered structure, the different layers that form the antireflective structure are added.

For the successive addition of the different layers (2, 4, 5, 6 . . . ) to the transparent (1) substrate, a metal and/or dielectric compound deposition procedure is used, such as chemical vapour deposition (CVD) or physical vapour deposition (PVD). The preferred manner, within the range of PVD techniques, is "magnetron sputtering".

To determine solar absorbance and thermal emissivity, an spectroscopic study of the coating is carried out, studying the reflectance in the spectral visible-infrared range, together with the solar energy spectrum and thermal emission spectrum at 400° C., giving low reflectance values in the solar spectrum zone, which means high absorbance (above or equal to 95%), and high reflectance values in the thermal emission zone, which mean low emissivity (less than or equal to 0.2).

Evidently, variants of the described procedure exist, known by experts in the field, which depend on which materials are used and the use of the coatings obtained.

The selective solar absorbent coating of the invention can be used as a coating for laminar materials or tubes selected from the group formed by steel, stainless steel, copper, aluminium or ceramic materials, in the absorbent elements of tower-type solar thermoelectric power plants and for use in absorbent element in Stirling dish systems or for use in absorbent tubes of solar thermoelectric power plants with parabolic-cylinder collectors.

Some examples of coatings according to the invention are shown below, as well as their reflectance properties and absorbance at different wave lengths. Said examples allow for the visualization of the coating's properties.

Example 1. Selective Absorbing Coating with Absorbent Structure of Two Zones Based On Molybdenum (Mo) and Aluminium Silicon Oxide ($SiAlO_x$)

On a substrate (1) of stainless steel 304 a layer of Mo of 300 nm is deposited. On this layer of Mo the absorbent multilayer structure consisting in two differentiated zones is deposited. The first zone has a total thickness of 52 nm, and consists in 285 layers of $SiAlO_x$ with a thickness of 0.08 nm alternated with another 285 of Mo with a thickness of 0.1 nm. The second zone has a total thickness of 57 nm, and consists in 390 layers of $SiAlO_x$ with a thickness of 0.08 nm alternated with another 390 of Mo with a thickness of 0.06 nm. The thickness of each of these layers is understood to mean the average thickness obtained from the data provided by a quartz crystal microbalance. On the absorbent multi-layer structure an antireflective reflective layer of $SiAlO_x$ with a thickness or 87 nm has been deposited.

Figure 5:
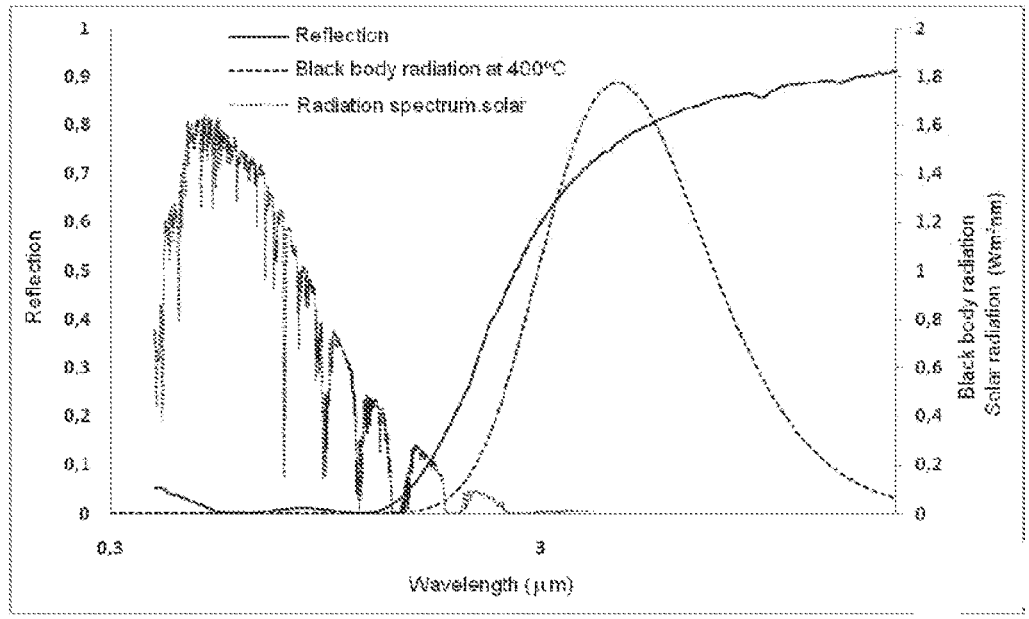
FIG. 5 shows the reflectance in the spectral visible-infrared range of the structure in example 1, together with the solar energy spectrum and thermal emission spectrum at 400° C.

With the aim of determining solar absorbance and thermal emissivity, a spectroscopic study of the coating in example 1 was performed and FIG. 5 shows the reflectance in the spectral visible-infrared range, together with the solar energy spectrum and the thermal emission spectrum at 400° C. The coating show low reflectance values in the solar spectrum zone, which means high absorbance, and high reflectance in the thermal emission zone, which means low emissivity. Determining global values, a solar absorbance of around 97.5% is obtained and an emissivity at 400° C. of around 0.15, which shows the suitability of the coating for use in thermal solar collectors and CCP solar collectors for thermoelectric plants.

Example 2. Selective Absorbing Coating with Absorbent Structure of Two Nickel (Ni) Based Zones a Silicon-Aluminium Oxide ($SiAlO_x$)

On a substrate (1) or stainless steel 304 a layer of Ni of 110 nm is deposited. On this layer of Ni the absorbent multilayer structure consisting in two differentiated zones is deposited. The first zone has a total thickness of 78 nm and consists in 340 layers of $SiAlO_x$ with a thickness of 0.085 nm alternated with another 340 of Ni with a thickness of 0.145 nm. The second zone has a total thickness of 55 nm, and consists in 490 layers of $SiAlO_x$ with a thickness of 0.08 nm alternated with another 490 of Ni with a thickness of 0.03 nm. The thickness of each of these layers is understood to mean the average thickness obtained from the data provided by a crystal quartz microbalance. On the absorbent multi-layer structure is placed an antireflective layer of SiAlOx with a thickness of 67 nm.

Figure 6:
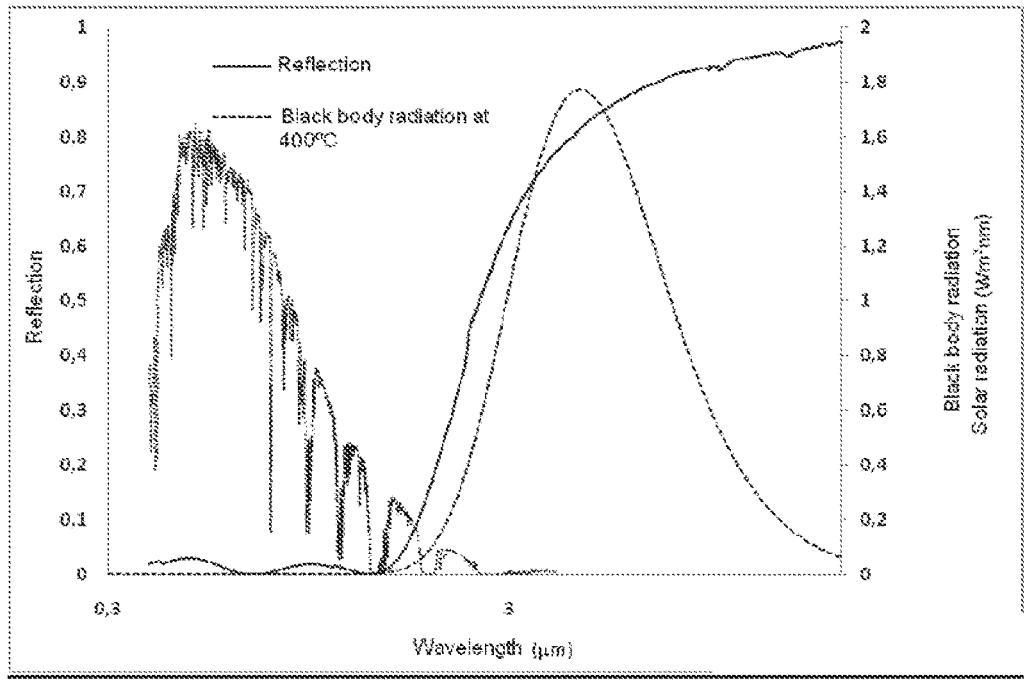
FIG. 6 shows the reflectance in the spectral visible-infrared range of the structure in example 2, together with the solar energy spectrum and thermal emission spectrum at 400° C. temperature.

With the aim of determining solar absorbance and thermal emissivity, a spectroscope study of the coating of example 2 was performed and FIG. 6 shows the reflectance in the spectral visible-infrared range, together with the solar energy spectrum and the thermal emission spectrum at 400° C. The coating shows low reflectance values in the solar spectrum zone, which means high absorbance, and high reflectance in the thermal emission zone, which means low emissivity. Determining global values, a solar absorbance of around 97.5% and emissivity at 400° C. around 0.08 was obtained, which demonstrates the suitability of the coating for its use in CCP solar thermal collectors for thermoelectric plants.

SUMMARY OF THE INVENTION

Selective Solar Absorbent Coating and Manufacturing Method

Selective solar absorbent coating and manufacturing method, with solar absorption and low emissivity properties. The coating comprises a substrate (1) of metal, dielectric or ceramic material, at least one highly reflective metal layer (2) in mid-far infrared applied to the substrate itself which provides low emissivity properties, a multi-layer structure of alternating dielectric and metallic layers (3) of subnanometric thickness applied to the reflective metal layer and at least one dielectric layer (4) that acts as an anti-reflective layer for the solar spectrum. The coating is applicable as a selective absorbent coating in absorbent tubes for parabolic-trough solar collectors, in solar panels for hot water, heating or domestic cooling, both in the form of absorbent tubes and absorbent sheets, in capture systems in tower solar thermoelectric power plants, and in capture systems in Stirling disk systems.

The invention claimed is:

1. A method for manufacturing a solar selective absorbing coating, comprising:
adding a metallic layer on a substrate of metallic, dielectric or ceramic material, wherein the metallic layer is highly reflecting in medium-far infrared;
depositing an absorbing multilayer structure on the metallic layer by alternatingly depositing at least 100 dielectric layers and at least 100 metal layers, the dielectric layers having an average thickness of less than 1 nm and the metal layers having an average thickness of less than 1 nm, and wherein the depositing the absorbing multilayer structure does not include depositing a cermet; and
depositing at least one anti-reflecting dielectric layer above the absorbing multilayer structure.

2. The method as in claim 1, wherein the depositing the dielectric layers is by reactive sputtering with inert gas and reactant gas in a chamber.

3. The method as in claim 2, wherein the depositing the metal layers is by DC sputtering and introducing inert gas exclusively in the chamber where the metal layers are being deposited.

4. The method as in claim 1, wherein the depositing the dielectric layers is carried out so that the dielectric layers have different thicknesses.

5. The method as in claim 1, wherein the depositing the dielectric layers is carried out so that the dielectric layers have the same thicknesses.

6. The method as in claim 1, wherein the depositing the dielectric layers step includes depositing each of the dielectric layers to have a thickness of less than 10 nm.

7. The method as in claim 1, wherein the depositing the absorbing multilayer structure step includes depositing the metal layers to have a total thickness of 5 to 1000 nm.

8. The method as in claim 1, wherein the depositing the metal layers is by DC sputtering and introducing inert gas exclusively in the chamber where the metal layers are being deposited.

9. The method as in claim 1, wherein the depositing the metal layers is carried out so that the metal layers have the same thicknesses.

10. The method as in claim 1, wherein the depositing the metal layers is carried out so that the metal layers have different thicknesses.

11. The method as in claim 1, wherein the depositing the metal layers step includes depositing each of the metal layers to have a thickness of less than 10 nm.

12. The method as in claim 1, wherein the alternatingly depositing the dielectric layers and the metal layers are performed by chemical vapor deposition (CVD).

13. The method as in claim 1, wherein the alternatingly depositing the dielectric layers and the metal layers are performed by physical vapor deposition (PVD).

14. The method as in claim 1, wherein the alternatingly depositing the dielectric layers and the metal layers are performed by magnetron sputtering.

15. The method as in claim 1, wherein the depositing the dielectric layers include depositing metallic oxides selected from the group consisting of tin oxides, zinc oxides, aluminum oxides, titanium oxides, silicon oxides, nickel oxides, chrome oxides, niobium oxides, tantalum oxides and a mixture thereof.

16. The method as in claim 1, wherein the depositing the dielectric layers include depositing nitrides of metallic elements selected from the group consisting of silicon nitrides, chrome nitrides, aluminum nitrides and a mixture thereof.

17. The method as in claim 1, wherein the depositing the metal layers include depositing a metal selected from the group consisting of silver (Ag), gold (Au), aluminum (Al), chrome (Cr), molybdenum (Mo), copper (Cu), nickel (Ni), titanium (Ti), niobium (Nb), tantalum (Ta), tungsten (W), palladium (Pd) and a mixture thereof.

18. The method as in claim 1, wherein the depositing the metal layers include depositing an alloy of a metal selected from the group consisting of silver (Ag), gold (Au), aluminum (Al), chrome (Cr), molybdenum (Mo), copper (Cu), nickel (Ni), titanium (Ti), niobium (Nb), tantalum (Ta), tungsten (W), palladium (Pd) and a mixture thereof.

19. The method as in claim 1, wherein depositing the dielectric layers comprises depositing $SiAlO_x$.

* * * * *